(12) United States Patent  
Minamitaka

(10) Patent No.: US 8,145,693 B2  
(45) Date of Patent: Mar. 27, 2012

(54) FIR FILTER APPARATUS, AUDIO APPARATUS AND FIR FILTER PROGRAM

(75) Inventor: Junichi Minamitaka, Kokubunji (JP)

(73) Assignee: Casio Computer Co., Ltd., Tokyo (JP)

( * ) Notice: Subject to any disclaimer, the term of this patent is extended or adjusted under 35 U.S.C. 154(b) by 487 days.

(21) Appl. No.: 12/470,679

(22) Filed: May 22, 2009

(65) Prior Publication Data

US 2009/0292753 A1 Nov. 26, 2009

(30) Foreign Application Priority Data

May 26, 2008 (JP) ................. 2008-136911

(51) Int. Cl.
*G06F 17/10* (2006.01)
*G06F 17/17* (2006.01)
(52) U.S. Cl. .............. 708/313; 708/300; 708/322
(58) Field of Classification Search .......... 708/300, 708/313, 322
See application file for complete search history.

(56) References Cited

U.S. PATENT DOCUMENTS

| | | | | |
|---|---|---|---|---|
| 5,532,820 A | * | 7/1996 | Strolle et al. | 386/307 |
| 5,576,837 A | * | 11/1996 | Strolle et al. | 386/312 |
| 5,742,532 A | * | 4/1998 | Van Duyne et al. | 708/313 |
| 5,744,742 A | * | 4/1998 | Lindemann et al. | 84/623 |
| 6,169,240 B1 | * | 1/2001 | Suzuki | 84/605 |
| 6,782,105 B1 | | 8/2004 | Sahara et al. | |
| 2004/0213416 A1 | * | 10/2004 | Dahl et al. | 381/63 |
| 2008/0170650 A1 | * | 7/2008 | Theil | 375/360 |
| 2008/0247553 A1 | | 10/2008 | Katayama | |

OTHER PUBLICATIONS

Axel Nackaerts, Bart De Moor, Rudy Lauwereins, Dynamic timbre matching for sound synthesis using time-varying parametric filters, Roc. 43rd IEEE Midwest Symp. on Circruts and Systems, Lansing MI, Aug. 8-11, 2000, pp. 1210-1213.*
Aaron B. Greenblatt, Jonathan S. Abel, and David P. Berners, A Hybrid Reverberation Crossfading Technique, 2010, IEEE ICASSP, pp. 429-432.*

* cited by examiner

*Primary Examiner* — Lewis A Bullock, Jr.
*Assistant Examiner* — Kevin G Hughes
(74) *Attorney, Agent, or Firm* — Holtz, Holtz, Goodman & Chick, PC

(57) ABSTRACT

A coefficient compensating unit 33 calculates based on a loop point and a cross-fade point of impulse response coefficient data renewed compensation impulse response coefficients specified for a cross-fade period defined between the cross-fade point and an end point of the impulse response coefficient data, and stores the calculated impulse response coefficients in a compensation coefficient memory 34, wherein the cross-fade point corresponds to a beginning point of the cross-fade period in which a cross-fading is performed to smoothly connect the end point with the loop point. A product-sum operation unit 36 reads audio signal data from an audio signal buffer 35 and reads from the compensation coefficient memory 34 impulse response data including the compensated impulse response coefficients specified for the cross-fade period, and multiplies the audio signal data by appropriate impulse response coefficients to obtain multiplication data and accumulates the multiplication data, outputting the accumulated data.

9 Claims, 17 Drawing Sheets

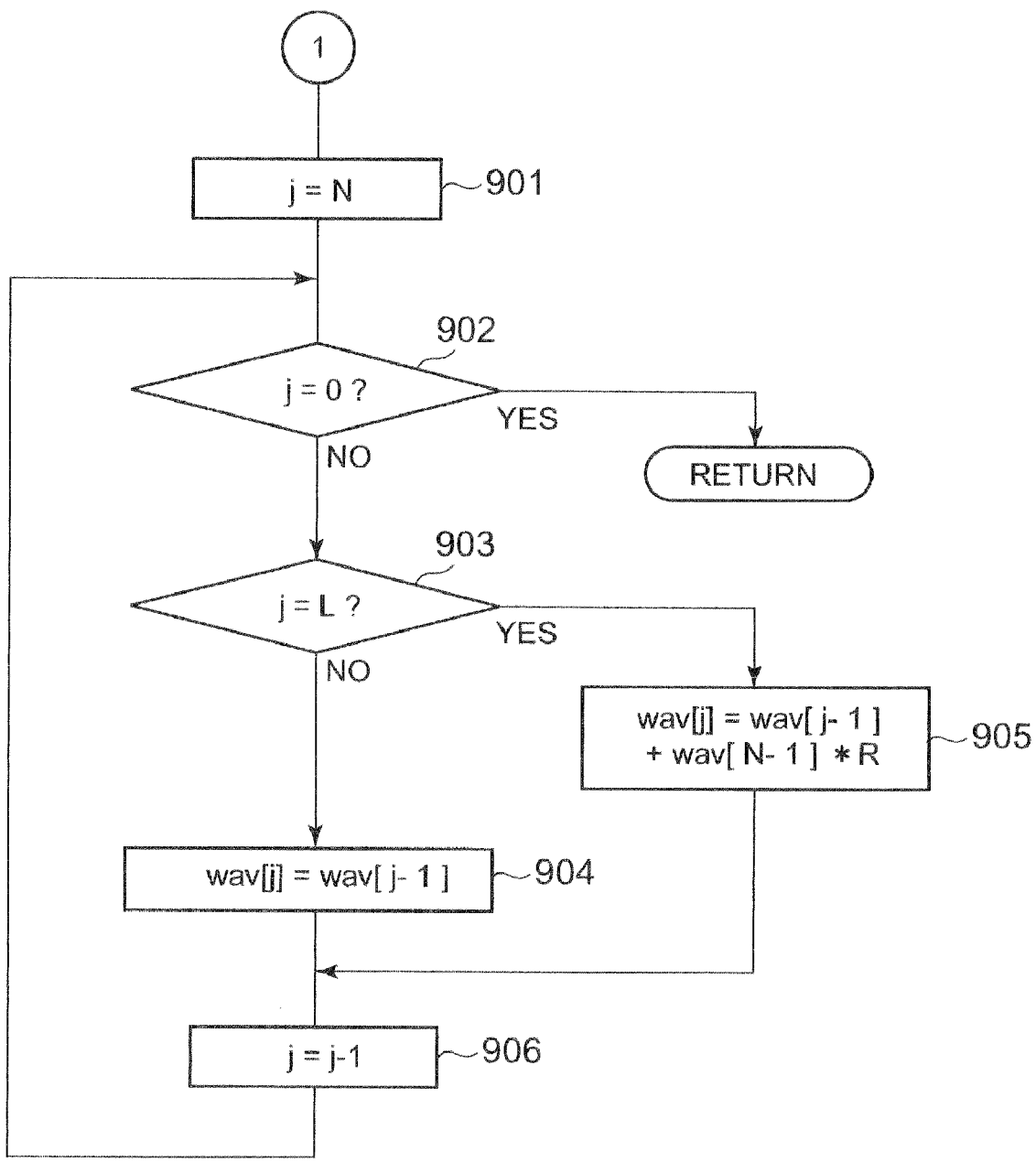

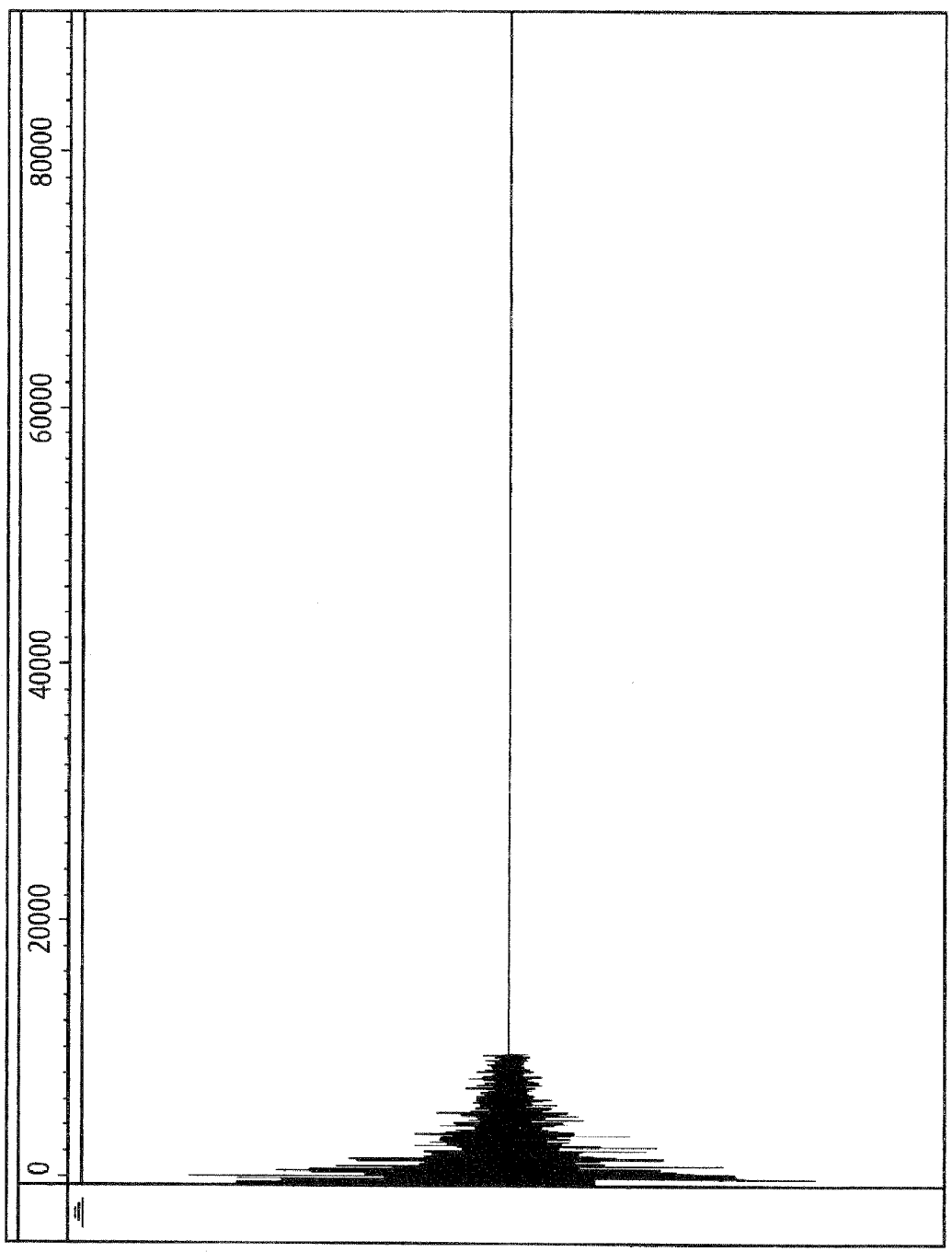

FIR FILTER APPARATUS, AUDIO APPARATUS AND FIR FILTER PROGRAM

CROSS-REFERENCE OF RELATED APPLICATION

The present application is based upon and claims the benefit of priority from the prior Japanese Patent Application No. 2008-136911, filed May 26, 2008, the entire contents of which are incorporated herein by reference.

BACKGROUND OF THE INVENTION

1. Field of the Invention

The present invention relates to an FIR filter apparatus (Finite Impulse Response Filter apparatus) for calculating impulse response coefficients and for performing a filtering process using the calculated impulse response coefficients, and further relates to an audio apparatus provided with such FIR filter apparatus and an FIR filter program.

2. Description of the Related Art

Various sorts of apparatuses are known for adding resonance tones to audio signals generated by an electronic musical instrument and audio apparatus, wherein the resonance tones include reverberation tones produced at a place including a hall, where musical tones are generated.

In general, a resonance tone adding apparatus receives digital audio signal data and performs a filtering process of a digital filter on the received digital audio signal data, thereby generating resonance tones. To perform the filtering process, FIR filter and/or IIR filter (Infinite Impulse Response FILTER) are used.

In the case where FIR filter is used, a convolution operation is performed on input audio signal data X(n−k) and impulse responses hn(k) obtained from reverberation characteristics of a hall, whereby a resonance tone $$y(n)=X(n-k) \times hn(k)$$

is obtained. Increasing the number of impulse response coefficients used in FIR filter, that is, increasing the number of filter taps will make filter characteristics more ideal, but will invite a disadvantage that increases the number of calculations to process the audio signal data.

For example, U.S. Pat. No. 6,782,105 B1 discloses a technique that generates a large number of resonance tones using less number of parameters. More specifically, two FIR filters are connected in series, and parameters (filter coefficients) extending for a long time duration are intermittently used in the former stage of FIR filter. Meanwhile, the parameters (filter coefficients) extending for a short time duration are used more frequently in the latter stage of FIR filter.

US Patent No. 2008-0247553 A1 discloses a technique, in which two FIR filters having different filter characteristics are used, and output of the former stage of FIR filter is supplied to the latter stage of FIR filter.

As described above, a series connection of FIR filters can generates a number of resonance tones and reflection tones. However, the above techniques have disadvantages that filter coefficients must be prepared for two filters, and a circuit scale will be made large and data volume to be processed will increase.

SUMMARY OF THE INVENTION

It is an object of the present invention to provide FIR filter apparatus, an audio apparatus, and FIR filter program, which are capable of generating natural resonance tones using a small scale of circuit and less data volume to process.

According to one aspect of the invention, there is provided FIR filter apparatus which comprises an audio signal storing unit for storing a series of audio signal data arranged along a time axis, an impulse response data storing unit for storing impulse response data including impulse response coefficients, each impulse response coefficient being specified by a value on the time axis, indicating impulse response characteristic, an impulse response coefficient compensating unit for calculating based on a loop point specified on the time axis and a cross-fade point specified on the time axis, renewed compensated impulse response coefficients falling in a cross-fade period defined between the cross-fade point and an end point specified on the time axis, when impulse response coefficients in a period defined between the loop point and the end point are repeated, and for storing the calculated renewed compensated impulse response coefficients in the impulse response data storing unit, wherein the loop point corresponds to a beginning point of the period in which the impulse response coefficients are repeated, and the end point corresponds to a tail end of the impulse response coefficients, and the cross-fade point is specified on the time axis between the loop point and the end point and corresponds to a beginning point of the cross-fade period in which cross-fading is effected, and a product-sum operation unit for reading the audio signal data from the audio signal storing unit and reading from the impulse response data storing unit impulse response data including the compensated impulse response coefficients falling in the cross-fade period, and for multiplying the audio signal data by appropriate impulse response coefficients among the read impulse response coefficients to obtain multiplication data and accumulating the multiplication data to output resonance tone data.

According to another aspect of the invention, there is provided an audio apparatus which comprises FIR filter apparatus, an audio signal generating unit for generating a series of audio signal data arranged along a time axis, and an adding unit, wherein FIR filter apparatus comprises an audio signal storing unit for storing the audio signal data generated by the audio signal generating unit, an impulse response data storing unit for storing impulse response data including impulse response coefficients, each impulse response coefficient being specified by a value on the time axis, indicating impulse response characteristic, an impulse response coefficient compensating unit for calculating based on a loop point specified on the time axis and a cross-fade point specified on the time axis, renewed compensated impulse response coefficients falling in a cross-fade period defined between the cross-fade point and an end point specified on the time axis, when impulse response coefficients in a period defined between the loop point and the end point are repeated, and for storing the calculated renewed compensated impulse response coefficients in the impulse response data storing unit, wherein the loop point corresponds to a beginning point of the period in which the impulse response coefficients are repeated, and the end point corresponds to a tail end of the impulse response coefficients, and the cross-fade point is specified on the time axis between the loop point and the end point and corresponds to a beginning point of the cross-fade period in which cross-fading is effected, and a product-sum operation unit for reading the audio signal data from the audio signal storing unit and reading from the impulse response data storing unit impulse response data including the compensated impulse response coefficients falling in the cross-fade period, and for multiplying the audio signal data by appropriate impulse response coefficients among the read impulse response coefficients to obtain multiplication data and accumulating the multiplication data to output resonance tone data, and the adding unit adds the audio signal data generated by the audio signal generating unit and the resonance tone data output from the product-sum operation unit of FIR filter apparatus.

According to other aspect of the invention, there is provided a computer readable recording medium to be mounted on an apparatus having a built-in computer, an audio signal storing unit for storing a series of audio signal data arranged along a time axis, and an impulse response data storing unit for storing impulse response data including impulse response coefficients, each coefficient being arranged along the time axis and indicating an impulse response characteristic, the computer readable recording medium storing FIR filter program when executed to make the built-in computer execute the steps which comprises an impulse coefficient compensating step of calculating based on a loop point specified on the time axis and a cross-fade point specified on the time axis, renewed compensated impulse response coefficients falling in a cross-fade period defined between the cross-fade point and an end point specified on the time axis, when impulse response coefficients in a period defined between the loop point and the end point are repeated, and storing the calculated renewed compensated impulse response coefficients in the impulse response data storing unit, wherein the loop point corresponds to a beginning point of the period in which the impulse response coefficients are repeated, and the end point corresponds to a tail end of the impulse response coefficients, and the cross-fade point is specified on the time axis between the loop point and the end point and corresponds to a beginning point of the cross-fade period in which cross-fading is effected, and a product-sum operation step of reading the audio signal data from the audio signal storing unit and reading from the impulse response data storing unit impulse response data including the compensated impulse response coefficients falling in the cross-fade period, and multiplying the audio signal data by appropriate impulse response coefficients among the read impulse response coefficients to obtain multiplication data and accumulating the obtained multiplication data to output resonance tone data.

BRIEF DESCRIPTION OF THE DRAWINGS

FIGS. 8 and 9 are flow charts showing a filtering process in the present embodiment.

FIG. 10a is a graph illustrating an example of an impulse response.

DETAILED DESCRIPTION OF THE PREFERRED EMBODIMENTS OF THE INVENTION

Figure 1:
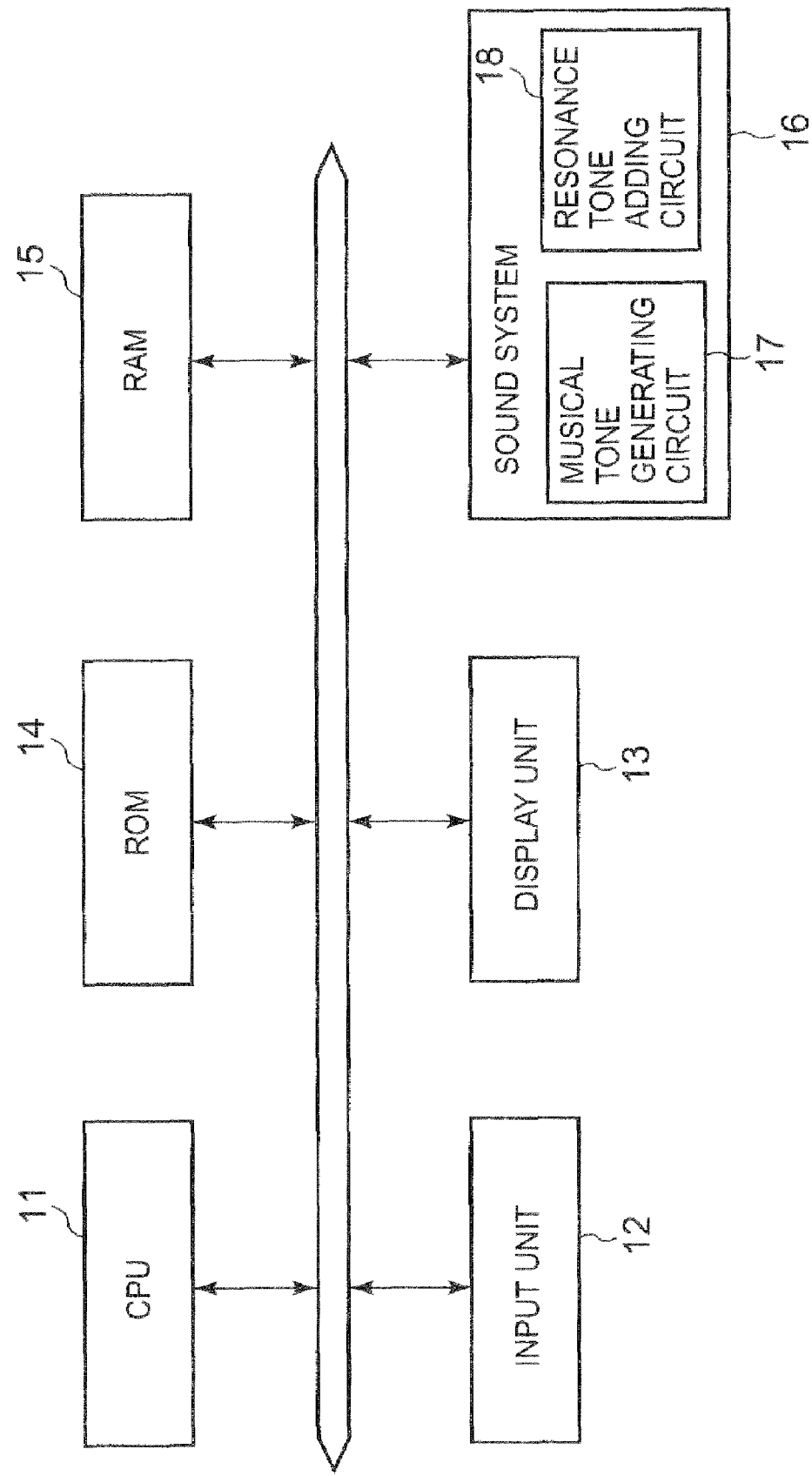
FIG. 1 is a block diagram showing a configuration of a musical tone generating apparatus having a resonance tone adding circuit according to an embodiment of the present invention.

Now, embodiments of the present invention will be described with reference to the accompanying drawings. FIG. 1 is a block diagram showing a configuration of a musical tone generating apparatus according to the embodiment of the invention. As shown in FIG. 1, the musical tone generating apparatus comprises CPU 11, an input unit 12, a display unit 13, ROM 14, RAM 15 and a sound system 16. Further, the sound system 16 comprises a musical tone generating circuit 17, a resonance tone adding circuit 18, D/A converter (not shown), an amplifier (not shown) and a speaker (not shown). In accordance with an instruction sent from CPU 11, the sound system 16 generates musical signal data, and generates resonance tone data based on the generated musical signal data for reproducing resonance tones, and further combines the musical signal data with the generated resonance tone data, thereby outputting composite data.

In the present embodiment, CPU 11 of the musical tone generating apparatus compensates impulse response coefficients (FIR filter coefficients). CPU 11 and the resonance tone adding circuit 18 compensate FIR filter coefficients of the present invention. CPU 11 and the resonance tone adding circuit 18 compose an FIR filter unit using the compensated FIR filter coefficients.

As shown in FIG. 1, it is possible to compose the musical tone generating unit using an average personal computer. Further, the musical tone generating unit can be used with a keyboard instrument having a keyboard (not shown). CPU 11 compensates impulse response coefficients of FIR filter, and generates image data to be displayed on the display unit 13. The input unit 12 has, for example, keyboard and mouse, and allows a user or an operator to input his or her desired instruction. On a screen of the display 13 can be displayed a graph of the impulse response, the instruction input by the operator, and results of a process performed for compensating the impulse response coefficients.

On ROM 14 are stored a program for compensating the impulse response coefficient, a program for generating the musical signal data, a program for performing the filtering process, constants used for running the program, the impulse response coefficients of FIR filter, and waveform data of various tone timbres for generating the musical signal data. On RAM 15 are temporarily stored necessary variables and parameters used in the course of running the program, input data and output data. Further, on RAM 15 are stored a setting condition for a filter set by the user and compensation coefficients obtained by compensating the impulse response coefficients.

Figure 2:
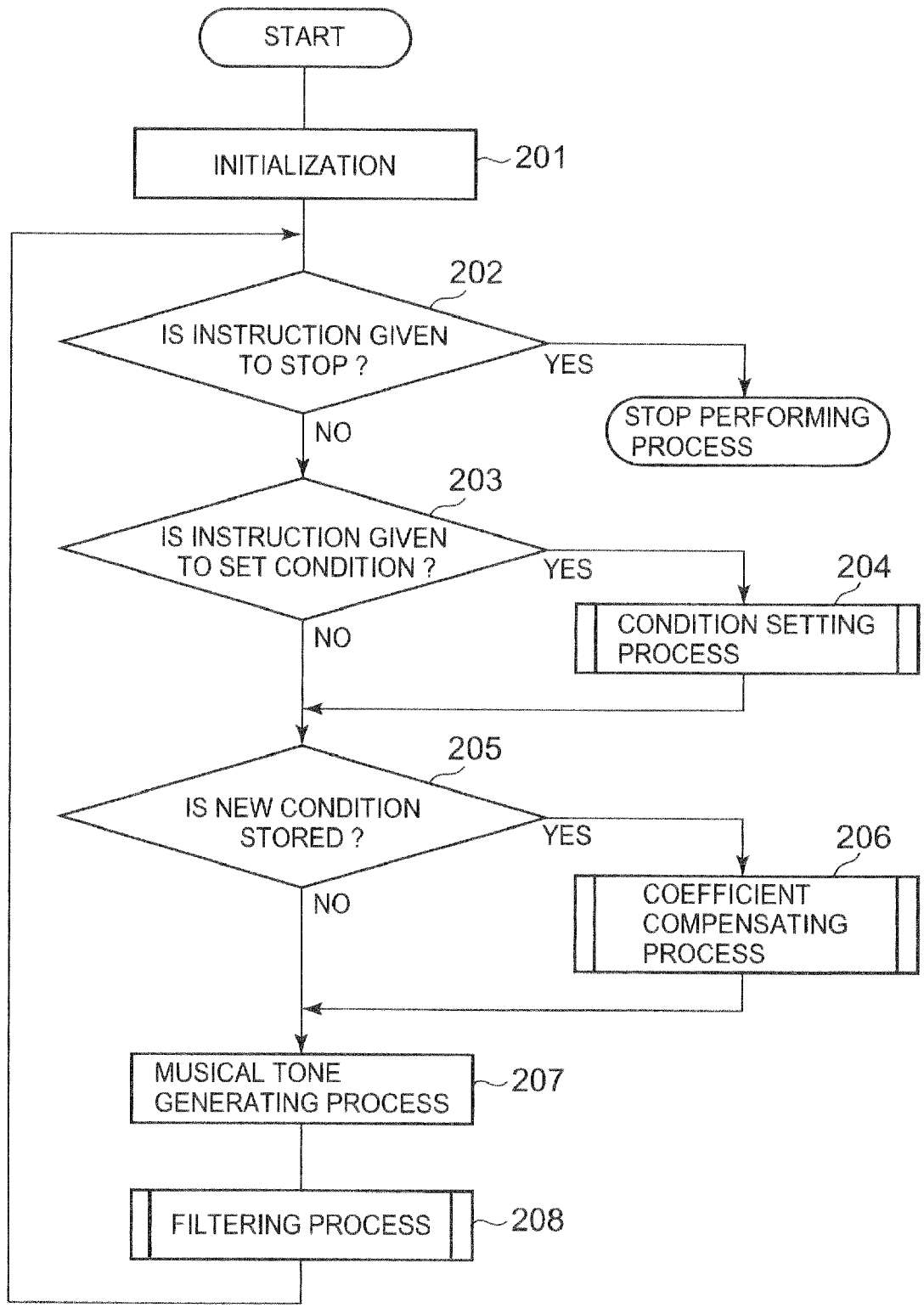
FIG. 2 is a flow chart of a process performed in the musical tone generating apparatus according to the embodiment of the invention.

FIG. 2 is a flow chart of a process performed in the musical tone generating apparatus according to the invention. CPU 11 performs an initializing process at step 201 in FIG. 2, clearing parameters stored on RAM 15 and data displayed on the screen of the display unit 13. Then process at steps 203 to 208 are performed until an instruction to stop performing the process is entered in response to user's operation performed on the input unit 12 (YES at step 202).

When an instruction to set a condition has been entered in response to user's operation on the input unit 12 (YES at step 203), CPU 11 performs a process of setting the condition at step 204. When data indicating a new condition has been stored in a setting condition memory 32 (to be described in FIG. 5) in the process of setting the condition at step 204 (YES at step 205), CPU 11 performs a process of compensating coefficients (coefficient compensating process) at step 206. The process of setting condition and the process of compensating coefficients will be described in detail later.

CPU 11 and the musical tone generating circuit 17 perform a process of generating a musical tone at step 207. In the process of generating a musical tone, CPU 11 gives an instruction in response to a pressing operation of any one of keys of the key board (not shown) and/or a note-on operation of a musical sound of a certain timbre in automatic performance data stored on ROM 14, and the musical tone generating circuit 17 reads waveform data of the timbre from ROM 14 and generates and outputs musical signal data having the timbre.

CPU 11 and the resonance tone adding circuit 18 perform the filtering process at step 208. In the filtering process, the resonance tone adding circuit 18 performs FIR filtering process on the musical signal data to generate resonance tone data, and then combines the musical tone data with the resonance tone data, thereby generating composite data. The filtering process will be described in detail later.

Figure 3:
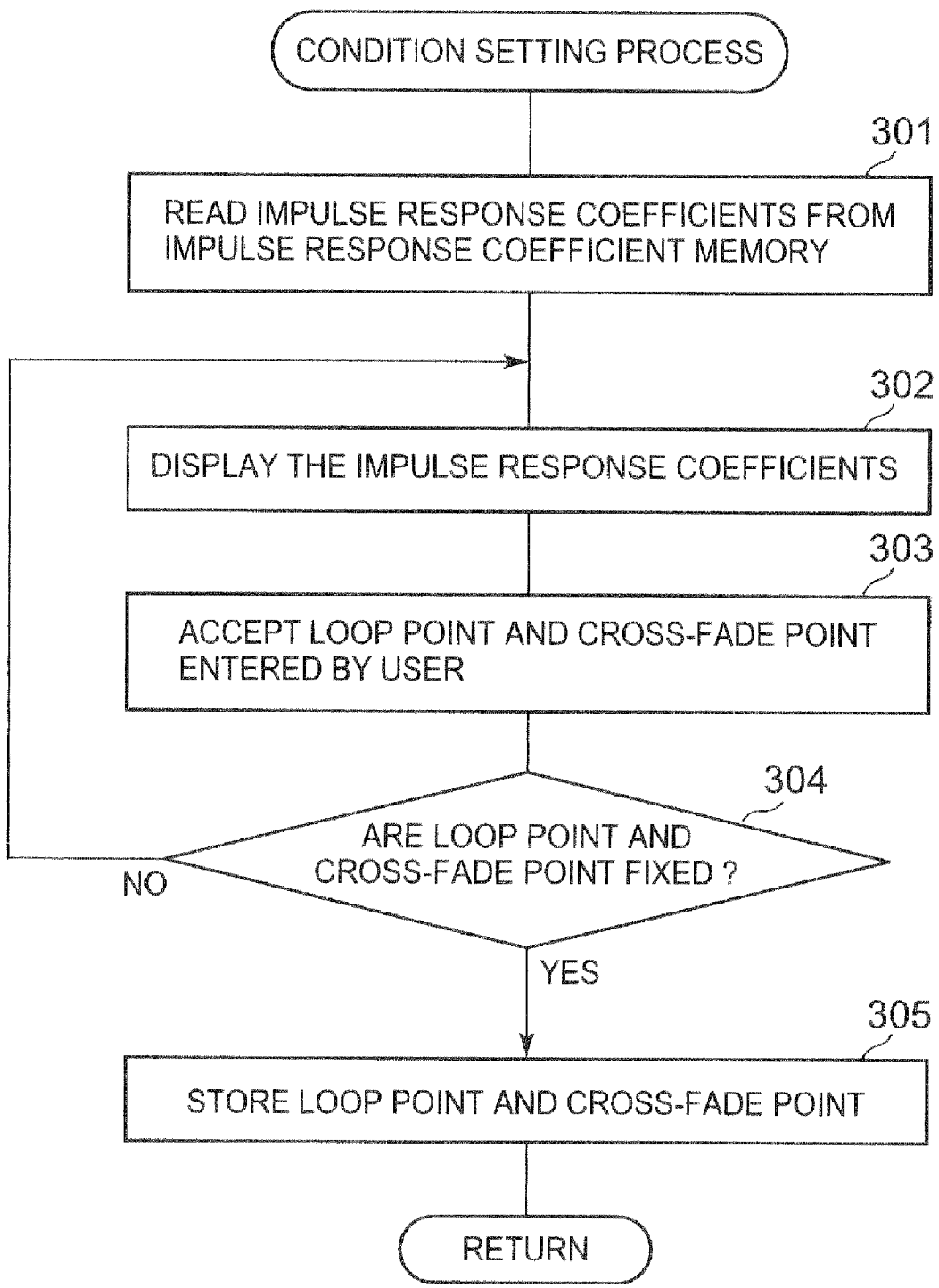
FIG. 3 is a flow chart of a process for setting a condition (condition setting process) in the present embodiment.

FIG. 3 is a flow chart of a process for setting a condition in the present embodiment of the invention. In the process for setting a condition, the user can designate his or her desired loop point "L" and a cross-fade point "XP" on a time axis of the impulse response coefficients of FIR filter.

Figure 4:
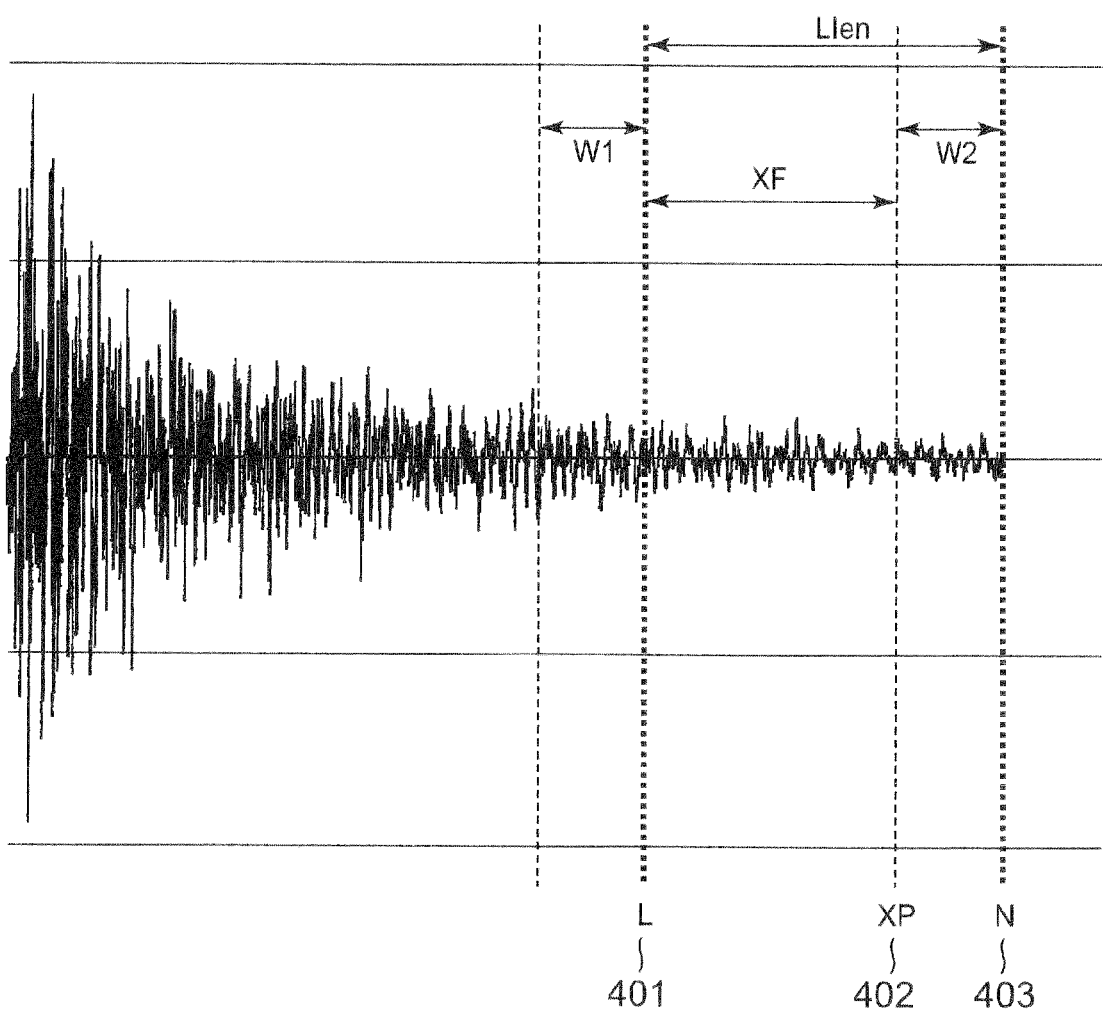
FIG. 4 is a view showing an example of an impulse response.

More specifically, CPU 11 reads impulse response coefficients from an impulse response coefficient memory 31 provided in ROM 14 (Refer to FIG. 5) at step 301, and displays on the screen of the display unit 13 a graph of the impulse response (a set of impulse response coefficients) indicated in an orthogonal coordinates with a horizontal axis (time axis) and a vertical axis (impulse response coefficient axis) at step 302. FIG. 4 is a graph showing an example of the impulse response. Operating the input unit 12, the user can designate a loop point "L" (Refer to a reference numeral 401) in the graph of the impulse response (the set of impulse response coefficients) displayed on the screen of the display unit 13, wherein a loop of the impulse response coefficients starts from the designated loop point "L". In the present embodiment, the tail end (the "N"th impulse response coefficient, "end point" 403) of the impulse response coefficients is not connected with the impulse response coefficient given at the loop point "L", but a cross-fading is effected in a cross-fade period W2 defined between the cross-fade point "XP" (402) and the end point "N" (403), whereby impulse response coefficients will be smoothly connected with each other in the loop, as will be described in detail later. The user can designate the cross-fade point "XP" (402) in the graph of the impulse response by operating the input unit 12.

When the loop point "L" and cross-fade point "XP" designated by the user's operation on the input unit 12 are accepted, the accepted loop point "L" and cross-fade point "XP" are temporarily stored on RAM 15 at step 303 in FIG. 3. When an instruction is given by the user's operation on the input unit 12 to fix the loop point "L" and cross-fade point "XP" (YES at step 304), CPU 11 stores the loop point "L" and cross-fade point "XP" in the setting condition memory 32 at step 305.

Figure 5:
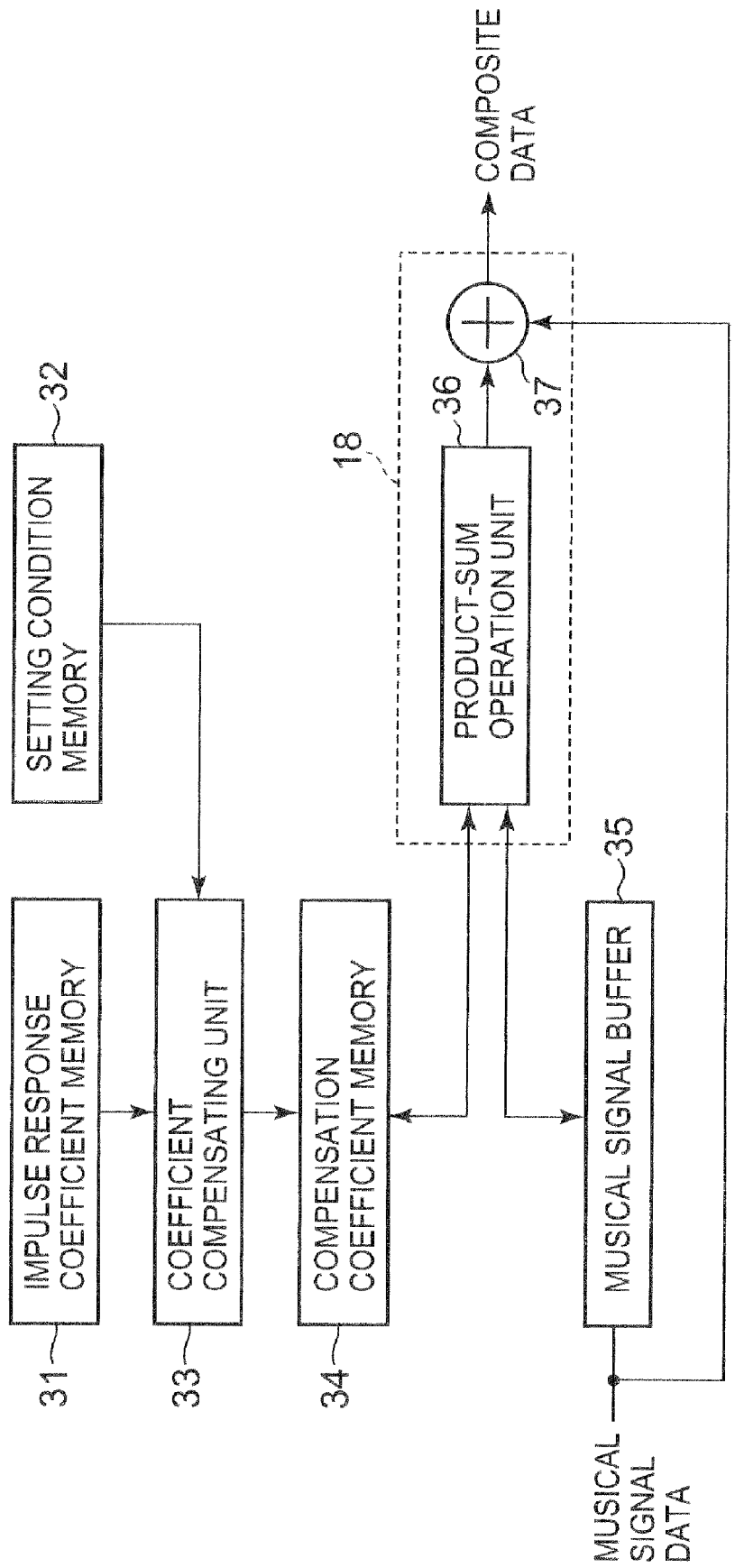
FIG. 5 is a block diagram showing a configuration of a circuit unit for compensating coefficients and for generating resonance tone data, in the musical tone generating apparatus according to the present embodiment.

The loop point "L" and cross-fade point "XP" stored in the setting condition memory 32 are used for compensating the impulse response coefficients. FIG. 5 is a block diagram showing a configuration of a circuit unit for compensating the impulse response coefficients and for generating resonance tone data in the musical tone generating apparatus according to the present embodiment. As shown in FIG. 5, the musical tone generating apparatus according to the present embodiment is provided with a coefficient compensating unit 33 for compensating impulse response coefficients. Based on the loop point "L" and the cross-fade point "XP" stored in the setting condition memory 32, the coefficient compensating unit 33 calculates compensated impulse response coefficients out of the impulse response coefficients, falling within the cross-fade period W2 as shown in FIG. 4. A new impulse response (a new set of impulse response coefficients) is stored in a compensation coefficient memory 34.

In the present embodiment, a function of the coefficient compensating unit 33 is realized chiefly by CPU 11. The impulse response coefficient memory 31 is provided in ROM 14, and meanwhile the setting condition memory 32 and the compensation coefficient memory 34 are provided in RAM 15.

As shown in FIG. 5, the resonance tone generating circuit 18 comprises a product-sum operation unit 36 and adder unit 37. A musical signal buffer 35 temporarily stores musical signal data supplied from the musical tone generating circuit 17 (FIG. 1). The musical signal buffer 35 is provided in RAM 15. The product-sum operation unit 36 performs a product-sum operation on the impulse response coefficients stored in the compensation coefficient memory 34 and the musical signal data stored in the musical signal buffer 35, thereby generating resonance tone data. In the present embodiment, the product-sum operation unit 36 is provided with a feed back circuit, through which musical signal data is fed back. In the arrangement of the product-sum operation circuit 36 with a feed back circuit, the impulse response coefficients are looped back or recycled, and the product-sum operation is performs using the looping-back impulse response coefficients. The adder unit 37 combines the musical signal data with the resonance tone data to generate composite data. The composite data is converted into an analog signal by D/A converter (not shown). The analog signal is amplified by the amplifier (not shown) and output as an acoustic signal through the speaker (not shown).

Figure 6:
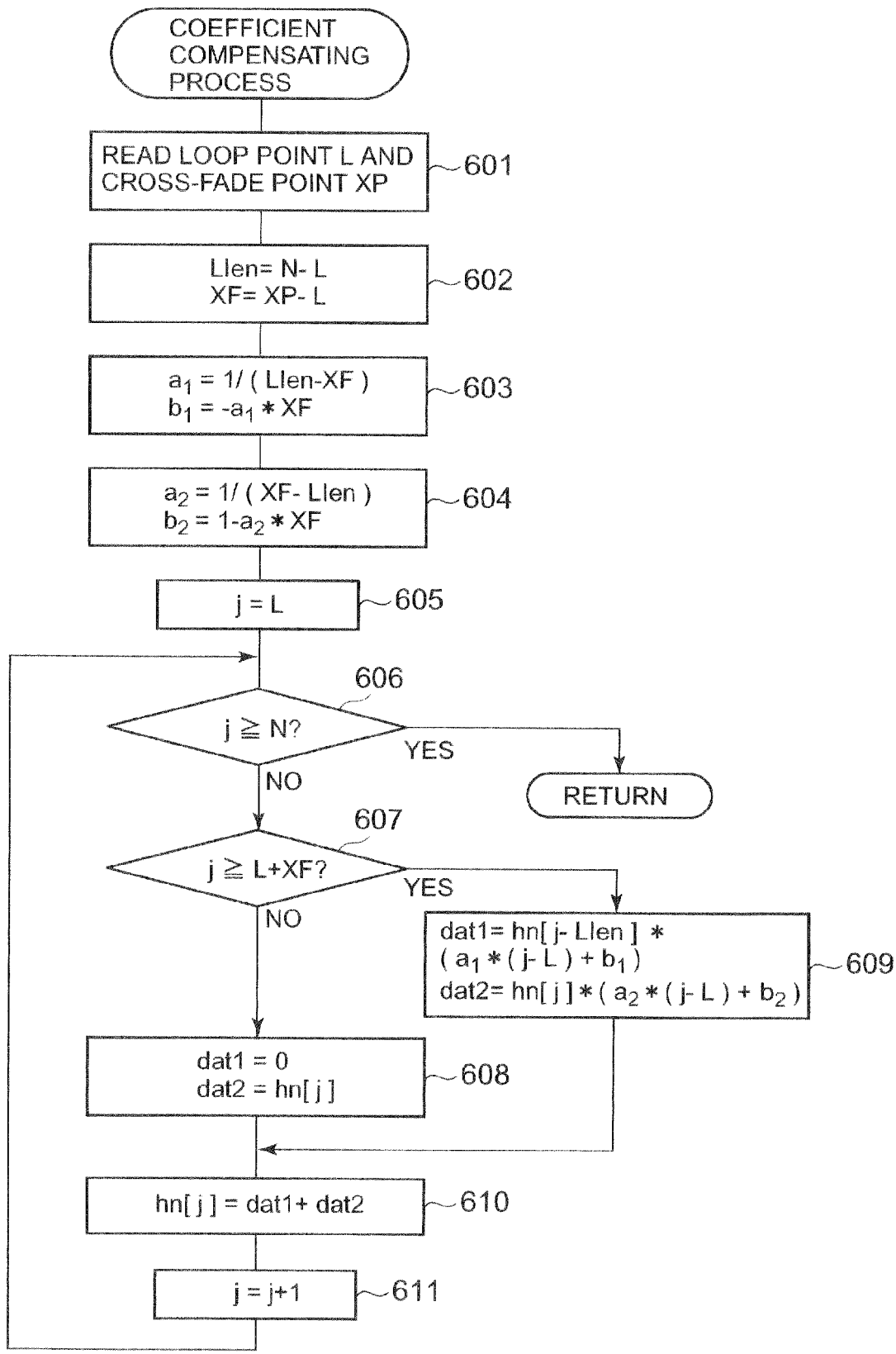
FIG. 6 is a flow chart of a coefficient compensating process (step 206 in FIG. 2) performed by the coefficient compensating unit according to the present embodiment.

FIG. 6 is a flow chart of the coefficient compensating process (step 206 in FIG. 2) performed in the coefficient compensating unit 33 according to the present embodiment. The coefficient compensating unit 33 reads the loop point "L" and cross-fade point "XP" from the setting condition memory 32 at step 601 in FIG. 6. Then, the coefficient compensating unit 33 calculates a difference "Llen" between the loop point "L" and the end point "N" of the impulse response coefficients, and a difference "XF" between the loop point "L" and the cross-fade point "XP" at step 602 (Refer to FIG. 4).

Figure 7A:
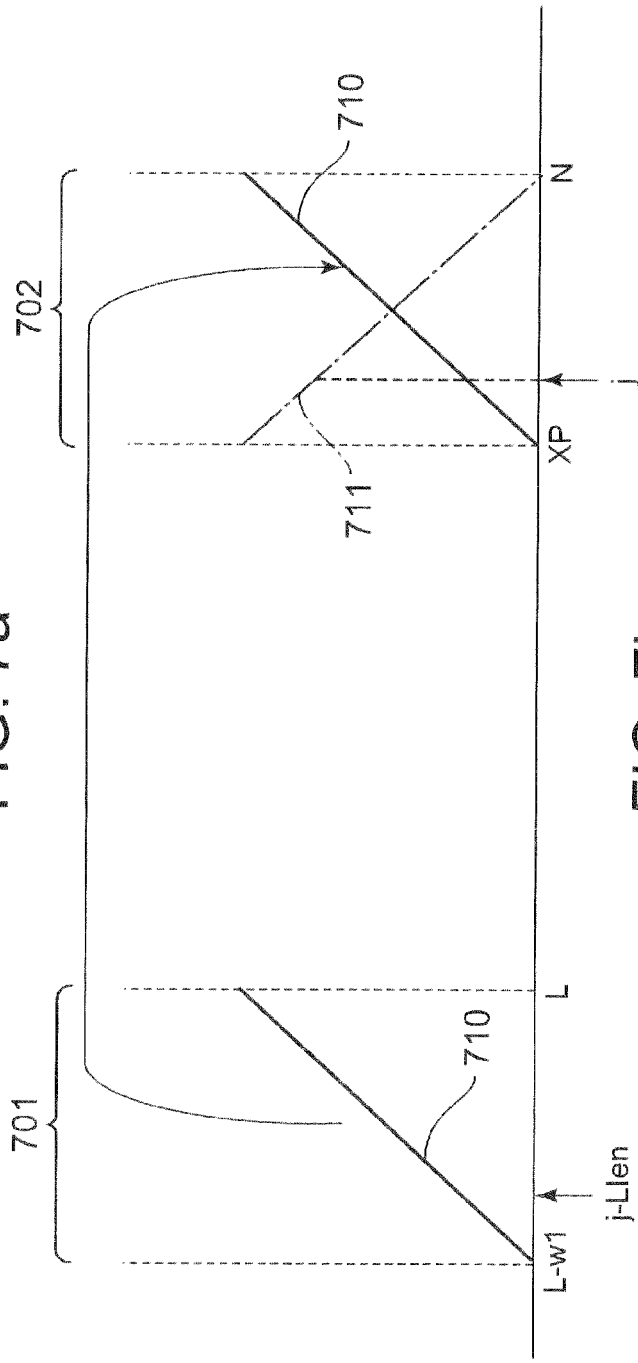
FIGS. 7a and 7b are views for explaining a cross-fading of the impulse response.
Figure 7B:
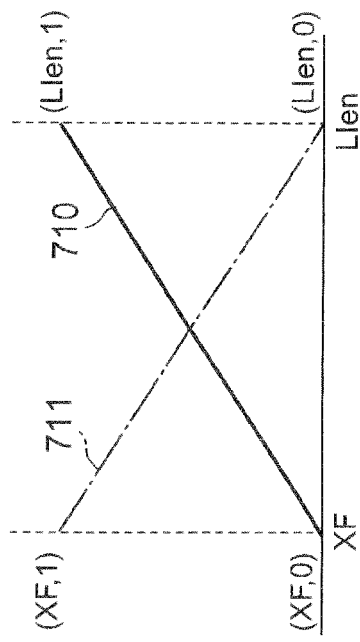

Further, the coefficient compensating unit 33 calculates coefficients for weighting impulse response coefficients to effect cross-fading in the period (cross-fade period W2) defined between the cross-fade point "XP" and the end point "N" of the impulse response coefficients at steps 603 and 604. FIGS. 7a and 7b are views for explaining the cross-fading of the impulse response coefficients. The cross-fade period is shown in FIG. 7a (Refer to a reference numeral 702). The width of the cross-fade period 702 is given by N−XP=W2=W1 (Refer to FIG. 4). Therefore, a period 701 between a point "L−W1" and the loop point "L" is equivalent to the cross-fade period 702. In the cross-fading, first weighted coefficients are obtained by multiplying the impulse response coefficients in the period 701 by an increasing function (reference numeral 710) which increases as time lapses, and second weighted coefficients are obtained by multiplying the impulse response coefficients in the cross-fade period 702 by a decreasing function (reference numeral 711) which decreases as time lapses. Then, the first weighted coefficients and the second weighted coefficients are added, and the sums of the first and second weighted coefficients are used as compensated impulse response coefficients in the cross-fading period 702.

More specifically, the coefficient compensating unit 33 calculates the increasing function at step 603, by which the impulse response coefficients in the period 701 are to be multiplied. In the present embodiment, both the increasing function and the decreasing function are linear functions. Therefore, a gradient and an intercept of each of the increasing and decreasing functions are obtained. At step 603, the gradient $a_1$ and the intercept $b_1$ of the increasing function are calculated as indicated below.

Gradient: $a_1 = 1/(Llen-XF)$

Intercept: $b_1 = -a_1 \times XF$

Further, the coefficient compensating unit 33 calculates the decreasing function at step 604, by which the impulse response coefficients in the period 702 are to be multiplied. At step 604, the gradient $a_2$ and the intercept $b_2$ of the decreasing function are calculated as indicated below.

Gradient: $a_2 = 1/(XF-Llen)$

Intercept: $b_2 = 1 - a_2 \times XF$

When it is presumed that the loop point is given at (0) on X-axis (horizontal axis) in FIG. 7a, the increasing function 710 and the decreasing function 711 will be given as indicated in FIG. 7b. The increasing function 710 is a linear function increasing from a coordinate point (XF, 0) to a coordinate point (Llen, 1) as shown in FIG. 7b. Meanwhile, the decreasing function 711 is a linear function decreasing from a coordinate point (XF, 1) to a coordinate point (Llen, 0). The gradient $a_1$ and intercept $b_1$ of the increasing function and the gradient $a_2$ and intercept $b_2$ of the decreasing function are calculated using the coordinates shown in FIG. 7b.

The coefficient compensating unit 33 initializes a parameter "j" to "L" at step 605, and repeatedly performs processes at steps 607 to 611 until the parameter "j" reaches "N" or more (YES at step 606). The coefficient compensating unit 33 judges at step 607 whether or not the parameter "j" has reached "L+XF" or more, that is, the coefficient compensating unit 33 judges whether or not the parameter "j" has reached the cross-fade point "XP" or more.

When it is determined at step 607 that the parameter "j" has not reached the cross-fade point "XP" (NO at step 607), the coefficient compensating unit 33 sets the first weighted coefficient "dat1" to "0" and the second weighted coefficient "dat2" to the original impulse response coefficient hn[j] at step 608. Thereafter, the coefficient compensating unit 33 sets the renewed compensated impulse response coefficient hn [j] to the sum of the first weighted coefficient "dat1" and second weighted coefficient "dat2" at step 610. The renewed compensated impulse response coefficients calculated at step 610 are stored in the compensation coefficient memory 34. In the range of "j<L", the impulse response coefficient hn [j] to be stored in the compensation coefficient memory 34 is the same as the original impulse response.

In the case where the parameter "j" is smaller than "L+XF" (NO at step 607), that is, in the case where the coefficient compensating unit 33 sets the first weighted coefficient dat1 to "0" and the second weighted coefficient dat2 to the original impulse response coefficient hn [j] at step 608, the impulse response coefficient hn [j] to be stored in the compensation coefficient memory 34 is the same as the original impulse response.

Meanwhile, when it is determined at step 607 that the parameter "j" has reached the cross-fade point "XP" or more (YES at step 607), the coefficient compensating unit 33 calculates the first weighted coefficient "dat1" and the second weighted coefficient "dat2" as below at step 609.

$$dat1 = hn[j-Llen] \times (a_1 \times (j-L) + b_1)$$

$$dat2 = hn[j] \times (a_2 \times (j-L) + b_2)$$

The first weighted coefficient "dat1" is obtained by multiplying the impulse response coefficient hn [j−Llen] falling in the period 701 shown in FIG. 7a by the increasing function 710 ($a_1 \times (j-L) + b_1$). The second weighted coefficient "dat2" is obtained by multiplying the impulse response coefficient hn [j] at the point "j" in the cross-fade period 702 shown in FIG. 7a by the decreasing function 711 ($a_2 \times (j-L) + b_2$).

The coefficient compensating unit 33 adds the first weighted coefficient "dat1" and the second weighted coefficient "dat2" to obtain a renewed compensated impulse response coefficient hn [j]. The obtained impulse response coefficient hn [j] is stored in the compensation coefficient memory 34 at step 610. Therefore, when the parameter "j" is larger than "L+XF" (YES at step 607), a cross-faded impulse response coefficient will be obtained.

The coefficient compensating unit 33 increments the parameter "j" at step 611, and returns to step 606.

Figure 8:
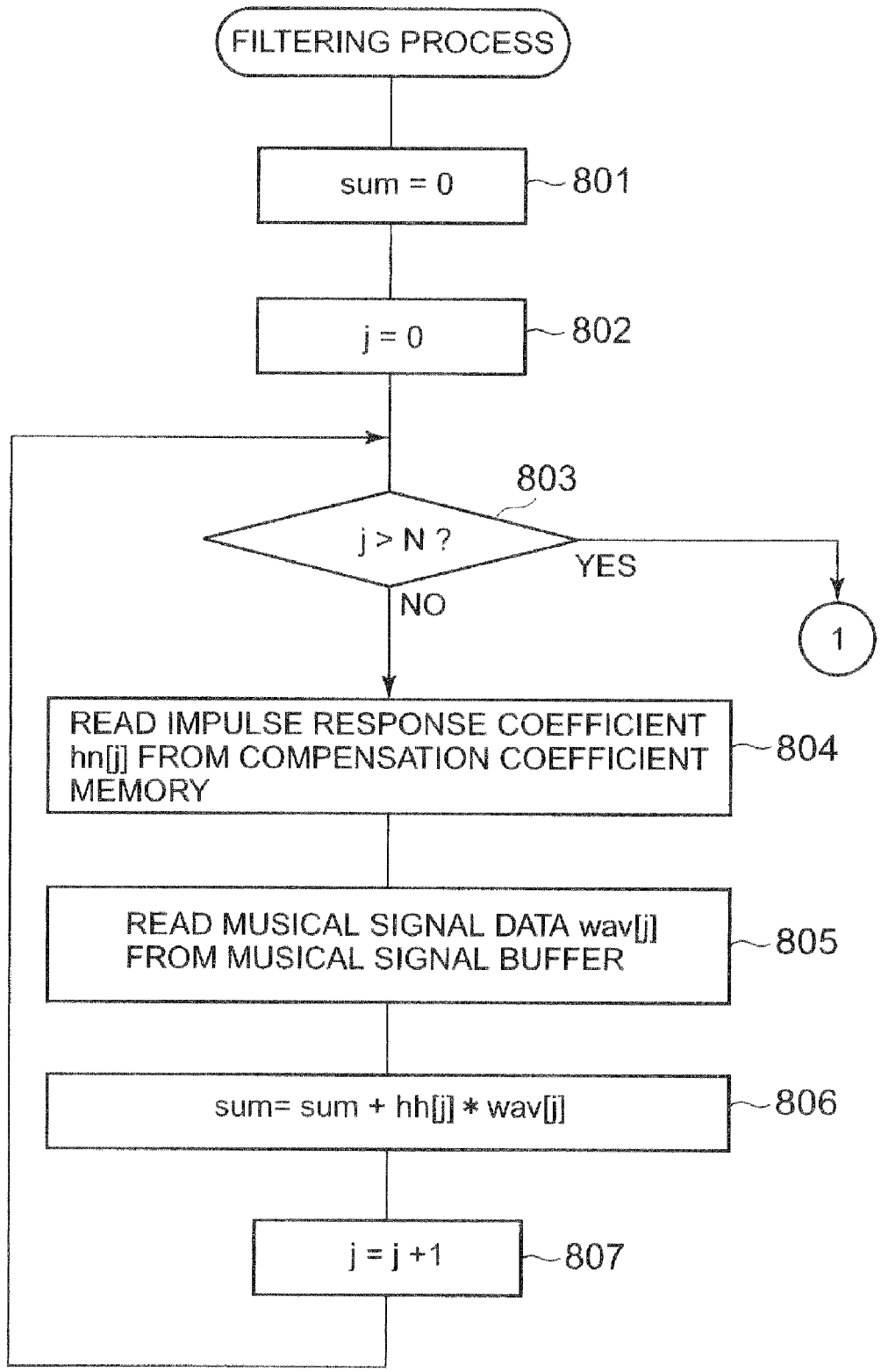

Now, the filtering process will be described, which includes the product-sum operation to be performed on the compensated impulse response coefficients stored in the compensation coefficient memory 34 and the musical signal data stored in the musical signal buffer 35. FIGS. 8 and 9 are flow charts of the filtering process in the present embodiment. The product-sum operation unit 36 of the resonance tone adding circuit 18 initializes an accumulated value "sum" to "0" at step 801, and initializes the parameter "j" to "0" for performing the product-sum operation at step 802. Then, the product-sum operation unit 36 repeatedly performs processes at steps 804 to 807 until the parameter "j" reaches the end point "N" (YES at step 803).

The product-sum operation unit 36 reads the impulse response coefficient hn[j] from the compensation coefficient memory 34 at step 804, and further reads musical signal data wav [j] from the musical signal buffer 35 at step 806. In the present embodiment, the parameter "j" in the impulse response coefficient hn [j] stored in the impulse response coefficient memory 31 and the compensation coefficient memory 34 corresponds to a value on the time axis. In the musical signal data wav [j] stored in the musical signal buffer 35, wav [0] indicates the latest musical signal data, and a larger parameter "j" indicates older musical signal data.

The product-sum operation unit 36 multiplies the musical signal data wav [j] by the impulse response coefficient hn [j] to obtain multiplication data "hn [j]×wav [j]" and adds an accumulated value "sum" to the multiplication data to obtain a new "sum" at step 806. Then, the product-sum operation unit 36 increments the parameter "j" at step 807, and returns to step 803.

When it is determined at step 803 that the parameter "j" has reached the end point "N" (YES at step 803), the product-sum operation unit 36 performs a delaying process on the musical signal data stored in the musical signal buffer 35 and performs a feeding back process of musical signal data of an appropriate level of fed back. The product-sum operation unit 36 initializes the parameter "j" to the end point "N" at step 901 in FIG. 9, and repeatedly performs processes at steps 903 to 906 until the parameter "j" reaches "0" (j=0) (YES at step 902).

The product-sum operation unit 36 judges at step 903 whether or not the parameter "j" has reached the loop point "L". When it is determined at step 903 that the parameter "j" has not reached the loop point "L" (NO at step 903), the product-sum operation unit 36 delays the musical signal data wav [j−1] stored in the musical signal buffer 35 to obtain musical signal data wav [j] at step 904. Meanwhile, when it is determined at step 903 that the parameter "j" has reached the loop point "L" (YES at step 903), the product-sum operation unit 36 multiplies the "N−1"th musical signal data by a feed back coefficient "R" to obtain data wav [N−1]×R, and adds the data of wav [N−1]×R to the musical signal data wav [j−1] to obtain musical signal data wav [j] at step 905. The feed back coefficient "R" is a positive integer smaller than "1". In the process at step 905, the "N−1"th musical signal data is fed back to musical signal data wav [L].

The product-sum operation unit 36 decrements the parameter "j" at step 906, and returns to step 902.

When it is determined at step 903 that "j=L" is true (YES at step 902), the musical signal data wav [n−1] is multiplied by the feed back coefficient "R" (feed back rate) and fed back to musical signal data wav [L] at step 905. While the processes at steps 902 to 906 are repeatedly performed, the fed back musical signal data is reflected in the musical signal data wav [L] to wav [N−1]. Therefore, in the product-sum operation performed on the impulse response coefficients and the musical signal data, substantially the same effects are realized as those realized when appropriate impulse response coefficients corresponding to the musical signal data wav [L] to wav [N−1] loop back or is recycled.

Figure 10B:
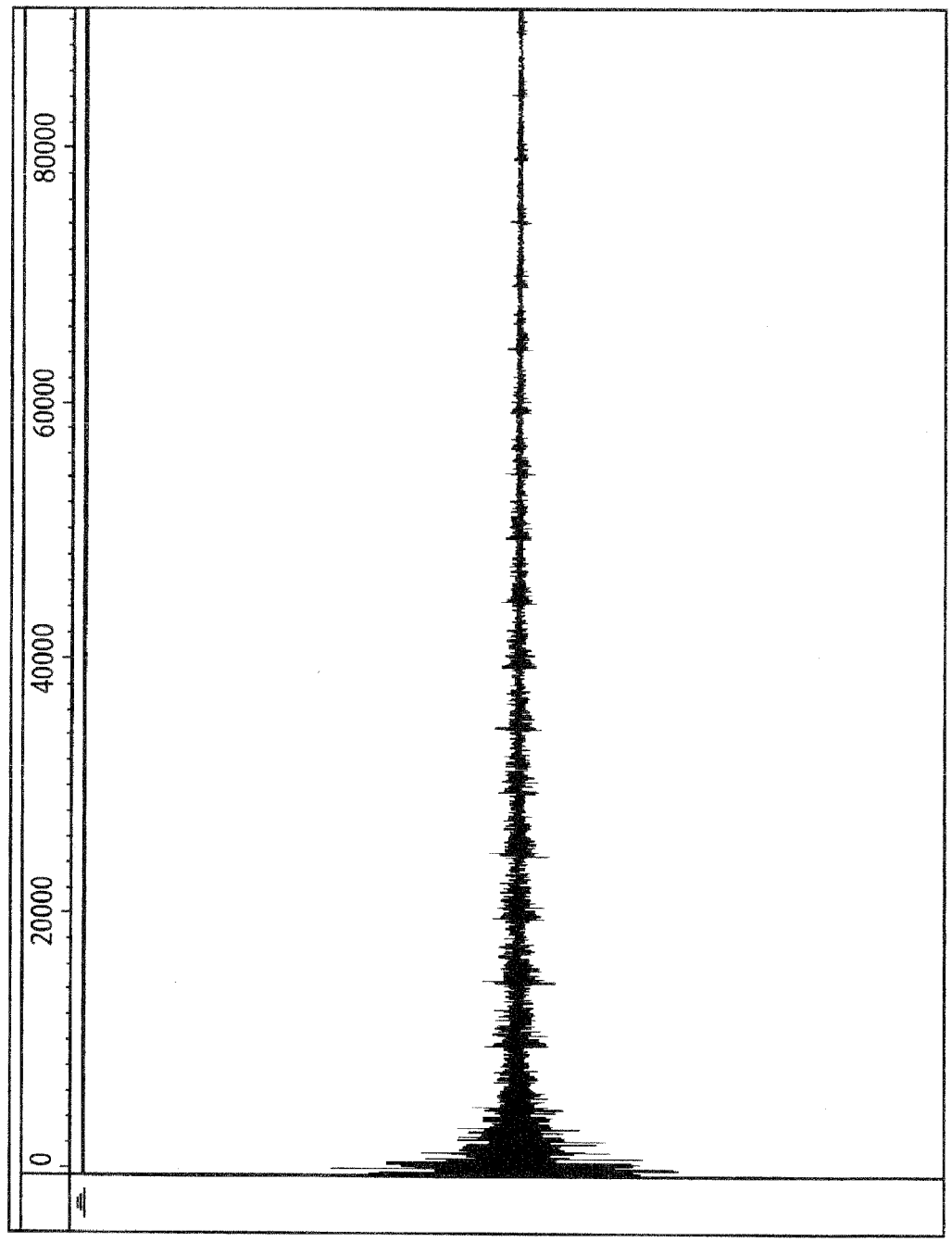
FIG. 10b is a graph illustrating an example of an impulse response.

FIGS. 10a, 10b and FIGS. 11a, 11b are graphs of the impulse responses (sets of impulse response coefficients). FIG. 10a is the graph of the original impulse response which does not loop back (first example of impulse response). FIG. 10b is the graph of the impulse response which loops backed but is not cross-faded, wherein the impulse response coefficients over a period between the loop point and tail end loop back but are not cross-faded to follow the tail end of the impulse response coefficients (second example of impulse response).

Figure 11A:
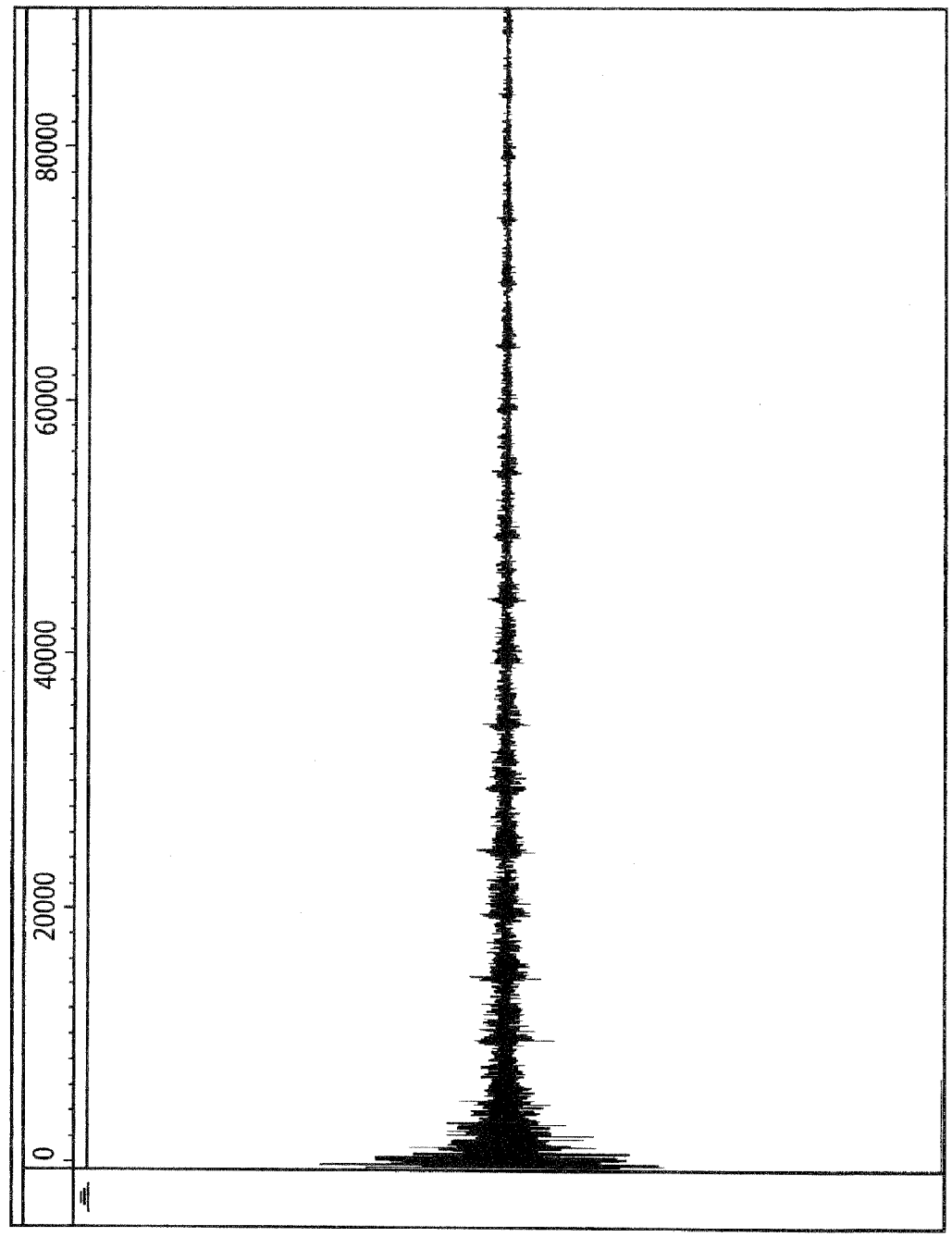
FIG. 11a is a graph illustrating an example of an impulse response.
Figure 11B:
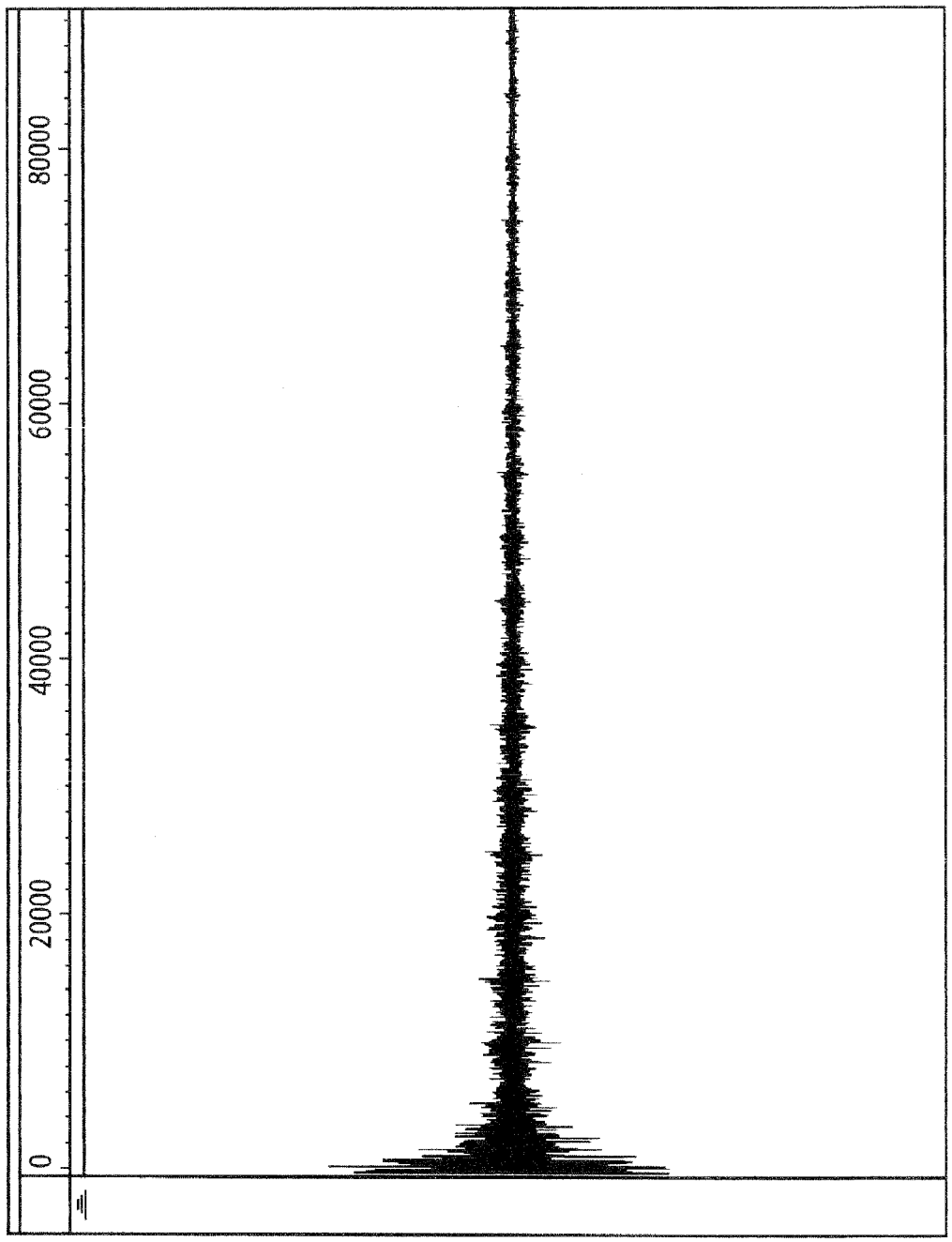
FIG. 11b is a graph illustrating an example of an impulse response.

FIG. 11a is a graph of the impulse response which is cross-faded, where XF/(N−L)=0.893 and XF=N−XP (first example of cross-faded impulse response). FIG. 11b is a graph of the impulse response which is cross-faded, where XF/(N−L)=0.393 and XF=N−XP (second example of cross faded impulse response).

Figure 12A:
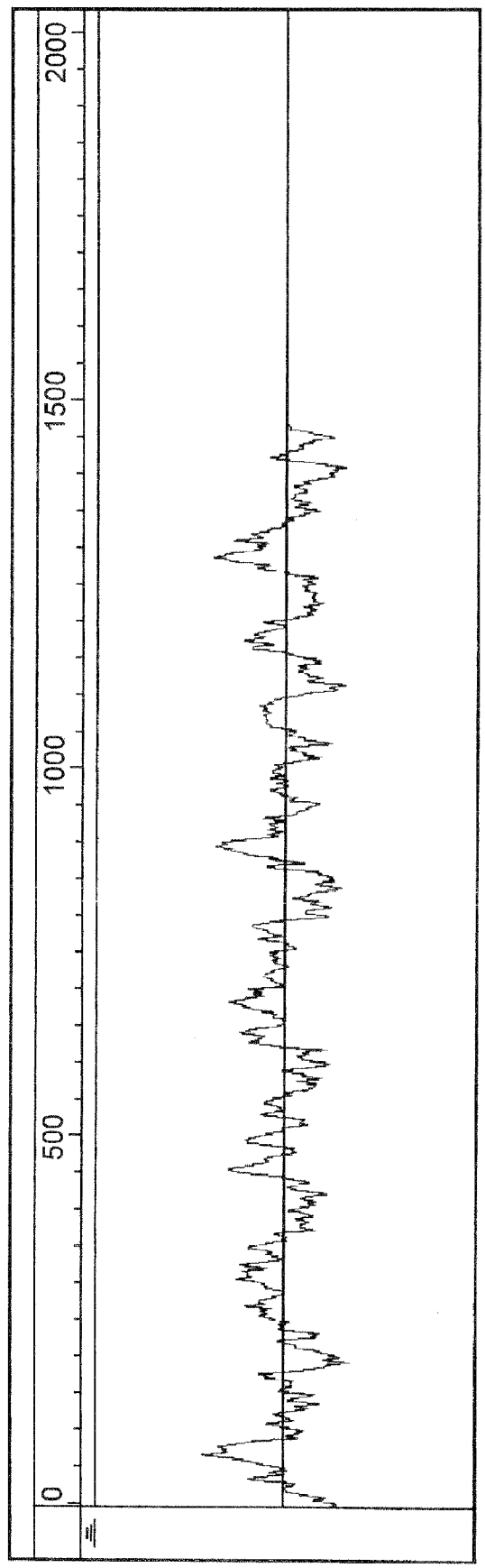
FIGS. 12a and 12b are enlarged views illustrating the impulse responses in the vicinity of a cross-fade point XP and an end point "N".
Figure 12B:
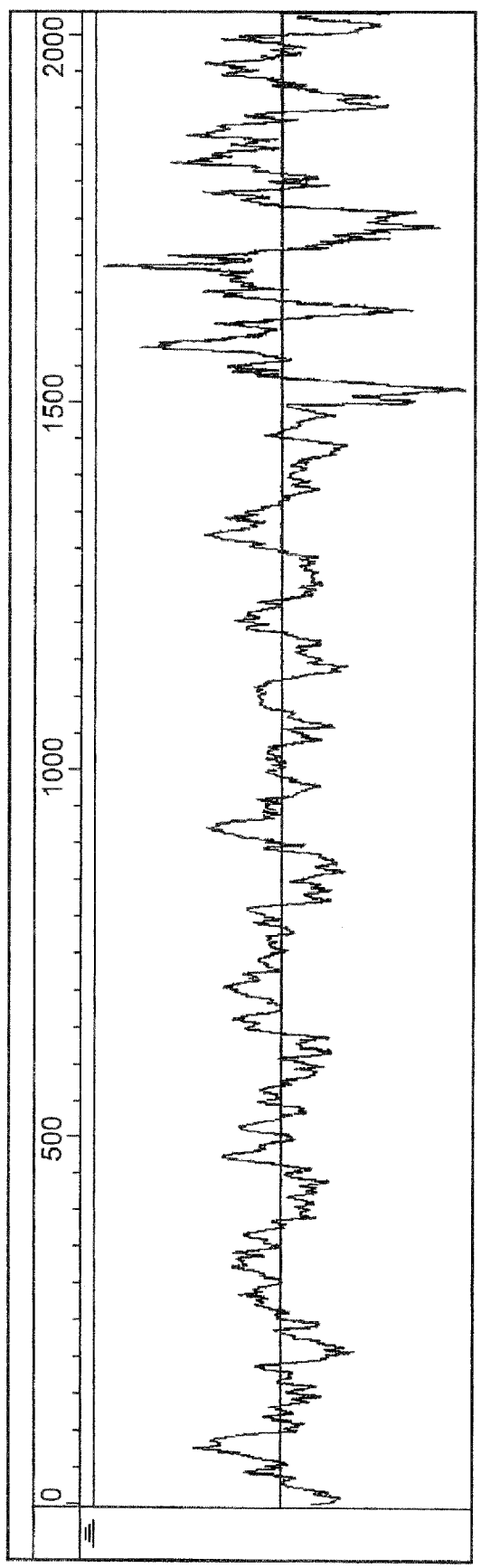
Figure 13A:
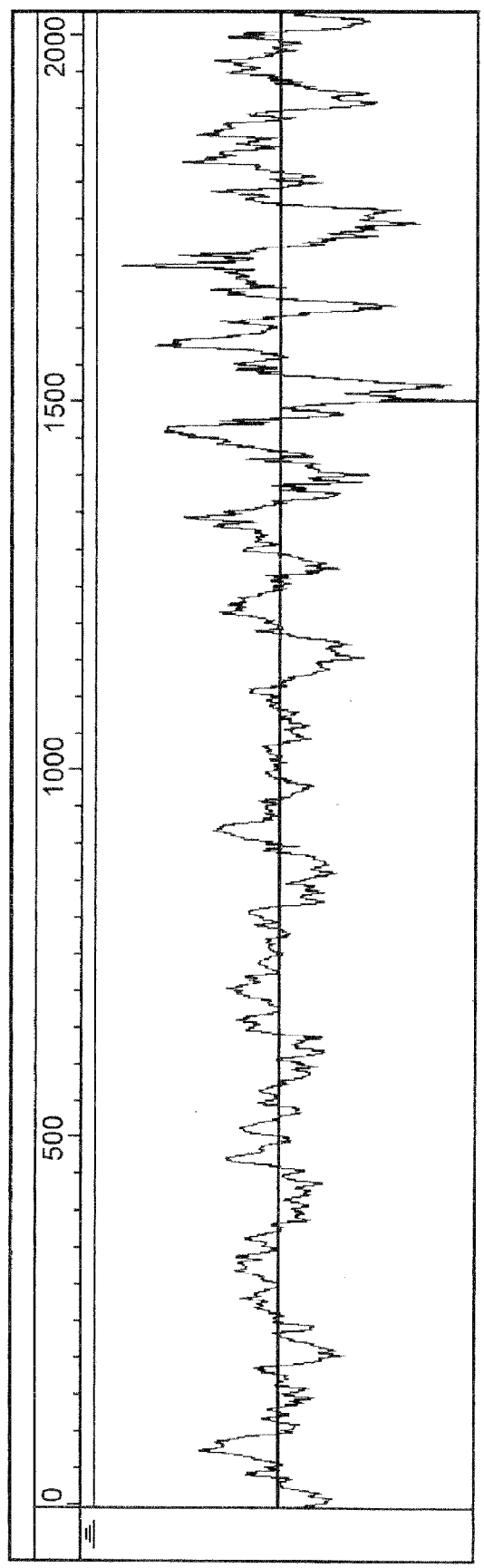
FIGS. 13a and 13b are enlarged views of the impulse responses in the vicinity of the cross-fade point XP and the end point "N".
Figure 13B:
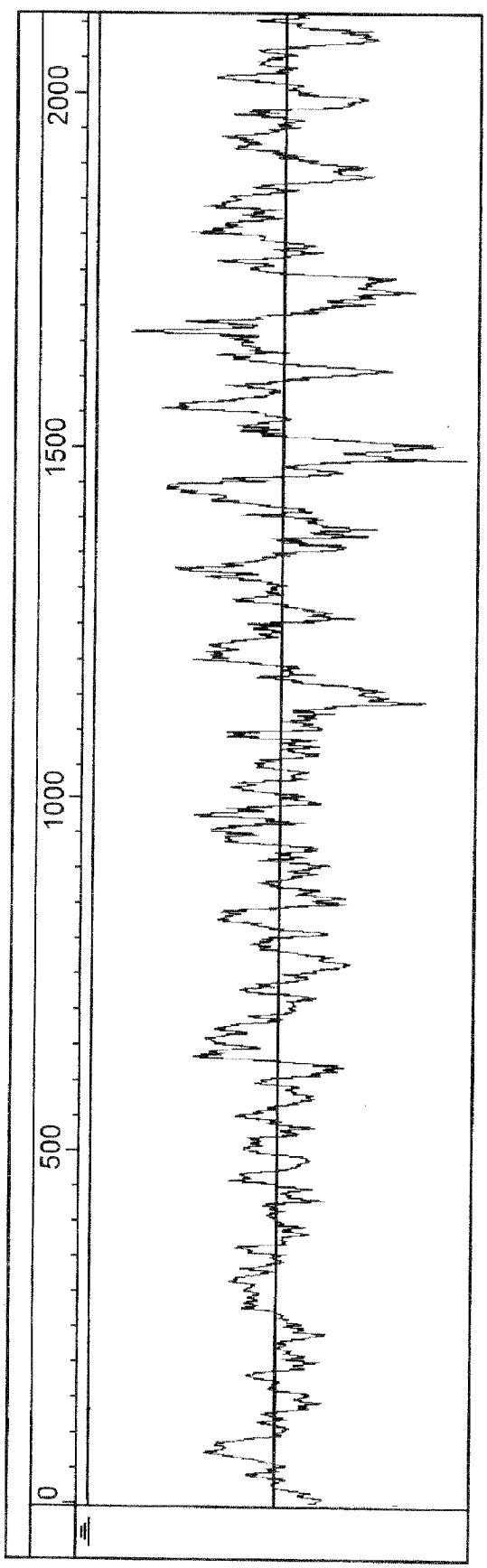

FIGS. 12a, 12b and FIGS. 13a, 13b are enlarged views of the impulse responses in the vicinity of the cross-fade point "XP" and end point "N". FIGS. 12a and 12b are enlarged views of the first example of impulse response (FIG. 10a) and the second example of impulse response (FIG. 10b). FIGS. 13a and 13b are enlarged views of the first example and second example of cross-faded impulse response. When the graph shown in FIG. 12b is compared with those shown in 13a and 13b, it will be understood that discontinuity of the impulse response (second example of impulse response shown in FIG. 10b) is smoothly connected, when the impulse response is cross-faded.

In the present embodiment, when the impulse response coefficients falling in the period defined by the loop point "L" and the end point "N" are repeated or recycled, the coefficient compensating unit 33 calculates new compensated impulse response coefficients for the cross-fade period W2 based on the cross-fade point XP and the loop point "L", and stores the calculated coefficients in the compensation coefficient memory 34, wherein the cross-fade point XP corresponds to a beginning point of the cross-fade period W2 in which the cross-fading is performed to smoothly connect the impulse response coefficient at the end point "N" with the impulse response coefficient at the loop point "L".

The product-sum operation unit 36 reads the impulse response coefficients stored in the compensation coefficient memory 34, and performs the product-sum operation on the read impulse response coefficients and the musical signal data. Therefore, the impulse response coefficient at the end point "N" is smoothly connected with the impulse response coefficient at the loop point "L". As a result, a natural resonance tone can be obtained by performing the product-sum operation on the musical signal data and the impulse response coefficients including those falling in the connecting portion of the both coefficients. Upon cross-faded, the looping-back impulse response coefficients allow to generate a sufficient resonance tone without increasing data volume of the impulse response coefficients.

In the present embodiment, the coefficient compensating unit 33 calculates the first weighted coefficients by multiplying the impulse response coefficients by a weight based on an increasing function (Refer to the reference numeral 710 in FIGS. 7a and 7b), wherein said impulse response coefficients fall in a period extending back from the loop point "L" by a time duration W1 corresponding to the cross-fade period and the increasing function increases in the extending-back period, and calculates the second weighted coefficients by multiplying the impulse response coefficients falling in the cross-fade period by a weight based on a function (Refer to the reference numeral 711 in FIGS. 7a and 7b) decreasing in the cross-fade period, and adds the calculated first and second weighted coefficients. The sums of the calculated first and second weighted coefficients are used as compensated impulse response coefficients in the cross-fade period. Using the compensated impulse response coefficients calculated as above, smooth cross-fading of the impulse response coefficients can be realized in the cross-fade period, and the impulse response coefficient at the end point "N" and the impulse response coefficient at the loop point "L" are smoothly connected.

Further, in the present embodiment, the product-sum operation unit 36 delays the musical signal data stored in the musical signal buffer 35, and multiplies the musical signal data in the musical signal buffer 35 by a predetermined reducing rate "R". The musical signal data multiplied by the reducing rate "R" is fed back and added to the musical signal data to be multiplied by the impulse response coefficient at the loop point. When the musical signal data stored in the musical signal buffer 35 is fed back to a position corresponding to the loop point, the musical signal data following the musical signal data at the position corresponding to the loop point and the impulse response coefficients are successively subjected to the product-sum operation during the product-sum operation to be performed on the fed back musical signal data and the impulse response coefficients, whereby looping-back of impulse response coefficients is realized. As a result, a sufficient resonance tone can be obtained without increasing data volume of the musical signal data used in the product-sum operation.

The scope of the present invention is by no means restricted to the embodiments described above, but various sorts of alterations and/or modifications may be made to the embodiments mentioned above within the scope of the invention defined by the accompanying claims, and it is a matter of course that these alterations and/or modifications made to the embodiments fall within the scope of the invention.

In the embodiments described above, for example, musical signal data is generated in response to pressing a key of a keyboard or in accordance with note on a musical tone having a certain pitch in automatic playing data, and an FIR filtering process is performed on the generated musical signal data, whereby a resonance tone is generated. However, other arrangement may be made such that FIR filtering process is performed on data supplied from an audio apparatus to generate a resonance tone. In other words, data to be subjected to FIR filtering process is an acoustic signal data including musical signal data.

In the product-sum operation unit 36 in the embodiments described above, the (N−1)th musical signal data wav [L−1] is multiplied by the feed back rate "R" to obtain multiplication data, and the multiplication data is fed back to the loop point "L", whereby musical signal data wav [L] is acquired at the loop point "L". In other words, the musical signal data wav [L−1] is fed back to the loop point "L", and the musical signal data wav [L] is acquired at the loop point "L", whereby looping of musical signal data is realized. However, another arrangement may be made such that the larger number of musical signal data are stored in the musical signal buffer than the number of impulse response coefficients stored in the compensation coefficient memory 34 and the product-sum operation is performed on looping back or recycled impulse response coefficients and the musical signal data stored in the compensation coefficient memory 34.

In the embodiments, a linear function is used as the increasing and decreasing functions. But a sine function within 0 to π/2 may be used as the increasing function, and a cosine function within 0 to π/2 may be used as the decreasing function. Other functions such as a logarithm function and exponent function may be used, too.

What is claimed is:

1. A Finite Impulse Response (FIR) filter apparatus comprising:
   an audio signal storing unit for storing a series of audio signal data arranged along a time axis;
   an impulse response data storing unit for storing impulse response data including impulse response coefficients, each impulse response coefficient being specified by a value on the time axis and indicating an impulse response characteristic;
   an impulse response coefficient compensating unit for calculating, based on a cross-fade point specified on the time axis and a loop point specified on the time axis, renewed compensated impulse response coefficients falling in a cross-fade period defined between the cross-fade point and an end point specified on the time axis when impulse response coefficients in a period defined between the loop point and the end point are repeated, and for storing the calculated renewed compensated impulse response coefficients in the impulse response data storing unit, wherein the loop point corresponds to a beginning point of the period in which the impulse response coefficients are repeated, the end point corresponds to a tail end of the impulse response coefficients, and the cross-fade point is specified on the time axis between the end point and the loop point and corresponds to a beginning point of the cross-fade period in which cross-fading is effected; and
   a product-sum operation unit for reading the audio signal data from the audio signal storing unit and reading from the impulse response data storing unit impulse response coefficients including the compensated impulse response coefficients falling in the cross-fade period, and for multiplying the audio signal data by appropriate impulse response coefficients among the read impulse response coefficients to obtain multiplication data and accumulating the multiplication data to output the accumulated data.

2. The FIR filter apparatus according to claim 1, wherein the impulse response coefficient compensating unit (i) multiplies impulse response coefficients falling in a period extending back from the loop point by a time duration corresponding to the cross-fade period by a weight based on a function increasing in the extending back period, thereby obtaining first weighting coefficients, (ii) multiplies impulse response coefficients falling in the cross-fade period by a weight based on a function decreasing in the cross-fade period, thereby obtaining second weighting coefficients, and (iii) adds the first and second weighting coefficients, wherein the sums of the first and second weighting coefficients are used as the renewed compensated impulse response coefficients in the cross-fade period.

3. The FIR filter apparatus according to claim 1, wherein the product-sum operation unit comprises:
   a delay circuit for delaying the audio signal data stored in the audio signal storing unit; and
   a feed back circuit for multiplying predetermined audio signal data stored in the audio signal storing unit by a predetermined decreasing rate to obtain multiplied audio signal data, and for feeding back the multiplied audio signal data to add said multiplied audio signal data to other audio signal data to be multiplied by the impulse response coefficient at the loop point.

4. The FIR filter apparatus according to claim 2, wherein the product-sum operation unit comprises:
   a delay circuit for delaying the audio signal data stored in the audio signal storing unit; and
   a feed back circuit for multiplying predetermined audio signal data stored in the audio signal storing unit by a predetermined decreasing rate to obtain multiplied audio signal data, and for feeding back the multiplied audio signal data to add said multiplied audio signal data to other audio signal data to be multiplied by the impulse response coefficient at the loop point.

5. An audio apparatus comprising:
   the FIR filter apparatus according to claim 1;
   an audio signal generating unit for generating a series of audio signal data arranged along a time axis to output the series of audio signal data to the audio signal storing unit of the FIR filter apparatus; and
   an adding unit for adding the audio signal data generated by the audio signal generating unit and resonance tone data output from the FIR filter apparatus.

6. An audio apparatus comprising:
   the FIR filter apparatus according to claim 2;
   an audio signal generating unit for generating a series of audio signal data arranged along a time axis to output the series of audio signal data to the audio signal storing unit of the FIR filter apparatus; and
   an adding unit for adding the audio signal data generated by the audio signal generating unit and resonance tone data output from the FIR filter apparatus.

7. An audio apparatus comprising:
the FIR filter apparatus according to claim 3;
an audio signal generating unit for generating a series of audio signal data arranged along a time axis to output the series of audio signal data to the audio signal storing unit of the FIR filter apparatus; and
an adding unit for adding the audio signal data generated by the audio signal generating unit and resonance tone data output from the FIR filter apparatus.

8. An audio apparatus comprising:
the FIR filter apparatus according to claim 4;
an audio signal generating unit for generating a series of audio signal data arranged along a time axis to output the series of audio signal data to the audio signal storing unit of the FIR filter apparatus; and
an adding unit for adding the audio signal data generated by the audio signal generating unit and resonance tone data output from the FIR filter apparatus.

9. A non-transitory computer readable recording medium storing a Finite Impulse Response (FIR) filter program that is executable by a computer comprising an audio signal storing unit for storing a series of audio signal data arranged along a time axis, and an impulse response data storing unit for storing impulse response data including impulse response coefficients, each coefficient being arranged along the time axis and indicating an impulse response characteristic, the FIR filter program being executable to cause the computer to perform steps comprising:

an impulse coefficient compensating step of calculating, based on a cross-fade point specified on the time axis and a loop point specified on the time axis, renewed compensated impulse response coefficients falling in a cross-fade period defined between the cross-fade point and an end point specified on the time axis, when impulse response coefficients in a period defined between the loop point and the end point are repeated, and storing the calculated renewed compensated impulse response coefficients in the impulse response data storing unit, wherein the loop point corresponds to a beginning point of the period in which the impulse response coefficients are repeated, the end point corresponds to a tail end of the impulse response coefficients, and the cross-fade point is specified on the time axis between the end point and the loop point and corresponds to a beginning point of the cross-fade period in which cross-fading is effected; and a product-sum operation step of reading the audio signal data from the audio signal storing unit and reading from the impulse response data storing unit impulse response coefficients including the compensated impulse response coefficients falling in the cross-fade period, and multiplying the audio signal data by appropriate impulse response coefficients among the read impulse response coefficients to obtain multiplication data and accumulating the obtained multiplication data to output the accumulated data.

\* \* \* \* \*